United States Patent [19]
Wiedmann et al.

[11] Patent Number: 5,453,949
[45] Date of Patent: Sep. 26, 1995

[54] BICMOS STATIC RAM WITH ACTIVE-LOW WORD LINE

[75] Inventors: Siegfried Wiedmann, Santa Clara; Frederick Buckley, III, San Jose, both of Calif.

[73] Assignee: Exponential Technology, Inc., San Jose, Calif.

[21] Appl. No.: 298,593

[22] Filed: Aug. 31, 1994

[51] Int. Cl.[6] .................................................. G11C 11/40
[52] U.S. Cl. .......................... 365/156; 365/154; 365/177
[58] Field of Search ................................... 365/154, 156, 365/177, 230.06, 230.08

[56] References Cited

U.S. PATENT DOCUMENTS

| | | | |
|---|---|---|---|
| 4,418,402 | 11/1983 | Heagerty | 365/156 |
| 4,623,989 | 11/1986 | Blake | 365/156 |
| 5,029,138 | 7/1991 | Iwashita | 365/208 |
| 5,047,980 | 9/1991 | Shookhtim | 365/177 |
| 5,111,429 | 5/1992 | Whitaker | 365/156 |
| 5,325,338 | 6/1994 | Runaldue | 365/156 X |

FOREIGN PATENT DOCUMENTS 60-179994  9/1985  Japan .................................... 365/156

Primary Examiner—David C. Nelms
Assistant Examiner—Son Mai
Attorney, Agent, or Firm—Stuart T. Auvinen

[57] ABSTRACT

A static RAM memory is ideally suited for BiCMOS processes. As in standard CMOS memory cells, the cells have cross-coupled inverters that have more efficient n-channel transistors for the drive transistors, which pull a bit line low during a read operation. The weaker p-channel transistors are used for load transistors in the cross-coupled inverters, adding to cell stability while requiring no power. In contrast to prior-art cells, p-channel pass transistors are used. Common-emitter word-line drivers are also used that require a small input-voltage swing in comparison with the large word-line voltage swing. A low voltage on the word line selects a memory cell by causing p-channel pass transistors to conduct, coupling bit lines to the cross-coupled inverters in the memory cell. Power consumption is reduced since only one selected word line is at a low voltage, while the deselected word lines are at a high voltage. Common-emitter word-line drivers have a conduction path from the positive supply terminal to ground when the output word line is low, but no conduction path when the output word line is high. Thus only the common-emitter word-line driver that is connected to the selected low word line consumes appreciable power.

15 Claims, 4 Drawing Sheets

Fig. 1 : Prior Art

BICMOS STATIC RAM WITH ACTIVE-LOW WORD LINE

BACKGROUND OF THE INVENTION—FIELD OF THE INVENTION

This invention relates to Static RAM memories, and more particularly to a BiCMOS word line driver accessing a CMOS memory cell.

BACKGROUND OF THE INVENTION—DESCRIPTION OF THE RELATED ART

Random access memories (RAMs) have increased in speed and density at a rapid pace. Complementary metal-oxide-semiconductor (CMOS) devices have been used extensively in constructing arrays of memory storage cells. CMOS technology provides very high densities of memory cells using n-channel and p-channel MOS transistors.

A popular CMOS memory cell is the six-transistor (6T) cell. FIG. 1 shows a typical prior-art 6T cell. The cell stores a bit of data in a cross-coupled latch consisting of two CMOS inverters. Load transistor 12 and driver transistor 16 form the first inverter, and load transistor 14 and driver transistor 18 are the second inverter. The output of one inverter is coupled to the input or gates of the other inverter. Pass transistors 20, 22 selectively connect a memory cell to a pair of bit lines 24, 26, when a row or word line 28 is activated by placing a sufficiently high voltage on it. The high word-line voltage turns on pass transistors 20, 22, causing them to conduct and connect the memory cell to the external bit lines. The construction and operation of the 6T cell is well-known in the art.

The 6T cell uses p-channel load transistors 12, 14, and n-channel driver transistors 16, 18. Because the hole mobility of p-channel transistors is lower than the electron mobility of the n-channel transistors, the p-channel transistors must be two or three times as large as an n-channel transistor to drive a desired current. The size of the transistor is defined by the "W/L" ratio, the ratio of the width of the channel or gate to the channel length. For a perfectly balanced cell, the W/L of the load transistors 12,14 would be twice as large as the W/L for the driver transistors 16, 18. However, the bit lines 24, 26 have a limited voltage swing and are biased at an intermediate voltage level. A typical 6T cell might have the bit lines 24, 26 biased at 3.0 volts for a 5-volt power supply. Under these conditions, the cell is read by applying 5 volts to the word line 28, turning on pass transistors 20, 22.

Cell stability on a read is an important design criteria. The bit lines 24, 26 are relatively large and have a high capacitance. Charge sharing between the bit lines 24, 26 and the cell can cause the cross-coupled latch in the cell to accidentally change state, losing the data stored in the cell. Cell stability is achieved by making pass transistors 20, 22 smaller than the driver transistors 16, 18, the pass transistors 20, 22 usually being about ⅓ the size of the driver transistors. The load transistors are made as small as possible to enhance cell switching while still stabilizing the cell against data loss. The load transistors are often just "leaker" transistors, designed to maintain the high logic state of one node in the cell when the cell is decoupled or deselected from the bit lines 24, 26. By keeping the load transistors 12, 14 small, the driver transistors 16, 18 only need be large enough to maintain cell stability when the pass transistors 20, 22 are turned on. Larger load transistors 12, 14 would impede cell switching.

As an example, typical minimum sizes in microns for the three types of transistors in a memory cell are 1/1 for the n-channel pass transistors 20, 22, 3/1 for the n-channel driver transistors 16, 18, and 1/5 for the p-channel load transistors 12, 14. Thus the current drive for the three types of devices might be 150 uA (microamps) for the pass transistors 20, 22, and 600 uA for the driver transistors, while less than 100 uA for the load transistors because of the lower saturation current of the p-channel transistors. Thus the p-channel load transistor has a current drive of less than one-sixth the current drive of the n-channnel driver transistor.

The driver transistors are characterized by having a high current drive, while the load transistors are characterized by a relatively small current drive. The pass transistors 20, 22 have an intermediate current drive, dictated by cell stability. All transistors are made as small as possible to achieve high density, but the relative sizes of the transistors must be carefully chosen.

Recently BiCMOS processes have emerged. BiCMOS includes both n-channel and p-channel CMOS transistors, and bipolar transistors. NPN bipolar transistors and resistors are usually available in BiCMOS processes, but PNP bipolar transistors are often not available or are inferior in current drive or other characteristics. Bipolar transistors have a much higher current-drive capability than CMOS transistors, but are not as compact in area as CMOS transistors. Bipolar transistors are used in BiCMOS chips for output drivers and internal clock drivers and other circuits requiring the high current-drive that bipolar can deliver.

CMOS memories suffer from high word-line capacitance from the many pass transistors connected to the word line 28 in a memory array. CMOS word-line drivers are inefficient at driving the large word-line capacitance. It would be an advantage to use bipolar word-line drivers that drive CMOS memory cells. However, the standard memory cell does not interface well with the standard NPN drivers.

What is desired is a memory cell and word-line driver circuits particularly adapted for a BiCMOS process having NPN transistors.

SUMMARY OF THE INVENTION

The invention uses common-emitter NPN drivers for the word lines. Since the common-emitter drivers pull a word line low to select it, at any one time only the selected word line has a common-emitter driver that conducts emitter current and thus dissipates power. The memory cell must be modified to have p-channel pass transistors since the selected word line has a low rather than a high voltage. Within the memory cell n-channel driver transistors and p-channel load transistors are used, allowing the bit lines to swing low on a read, so that standard sense amps and precharge circuits can be used with the invention.

A bipolar-CMOS (BiCMOS) memory device uses a pair of bit lines for communicating data to a p-channel pass transistor CMOS memory cell. The cell includes a first inverter having a first p-channel load transistor and a first n-channel driver transistor. The first inverter has a first output coupled to a drain of the first p-channel load transistor and coupled to a drain of the first n-channel driver transistor. The first inverter has a first input coupled to a gate for the first p-channel load transistor and coupled to a gate for the first n-channel driver transistor.

The cell also has a second inverter with a second p-channel load transistor and a second n-channel driver transistor.

The second inverter has a second output coupled to a drain of the second p-channel load transistor and coupled to a drain of the second n-channel driver transistor. The second inverter has a second input coupled to a gate for the second p-channel load transistor and coupled to a gate for the second n-channel driver transistor.

The first output of the first inverter is coupled to the second input of the second inverter and the second output of the second inverter is coupled to the first input of the first inverter to form a cross-coupled latch.

The cell features a first p-channel pass transistor coupled to conduct between the first output and the first bit line, the first p-channel pass transistor having a first gate; the cell also has a second p-channel pass transistor coupled to conduct between the second output and the second bit line, the second p-channel pass transistor having a second gate.

A word line selects a row of memory cells in the memory device. The word line is coupled to the first gate and the second gate of the p-channel pass transistors. The word line is driven by a common-emitter driver, which has a pull-up device coupled to the word line and an NPN transistor having a collector coupled to the word line. The common-emitter driver also has a select input coupled to a base input of the NPN transistor.

The NPN transistor conducts current away from the word line, causing a low voltage to occur on the word line when the select input indicates that the memory cell coupled to the word line be selected, the low voltage being sufficient to cause the first p-channel pass transistor and the second p-channel pass transistor to conduct. The select input disables the NPN transistor from conducting current away from the word line when the select input indicates that the word line not be selected, allowing the pull-up device to pull the word line to a high voltage. The high voltage is sufficient to cause the first p-channel pass transistor and the second p-channel pass transistor not to conduct.

In further aspects of the invention either the first p-channel pass transistor or the second p-channel pass transistor conduct the read current primarily in a saturation region of operation when the low voltage is applied to the word line. The saturation region has a current that is not dependent upon the voltage between the cell and the bit lines. Thus cell stability is improved.

DETAILED DESCRIPTION

The present invention relates to an improvement in digital memories. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
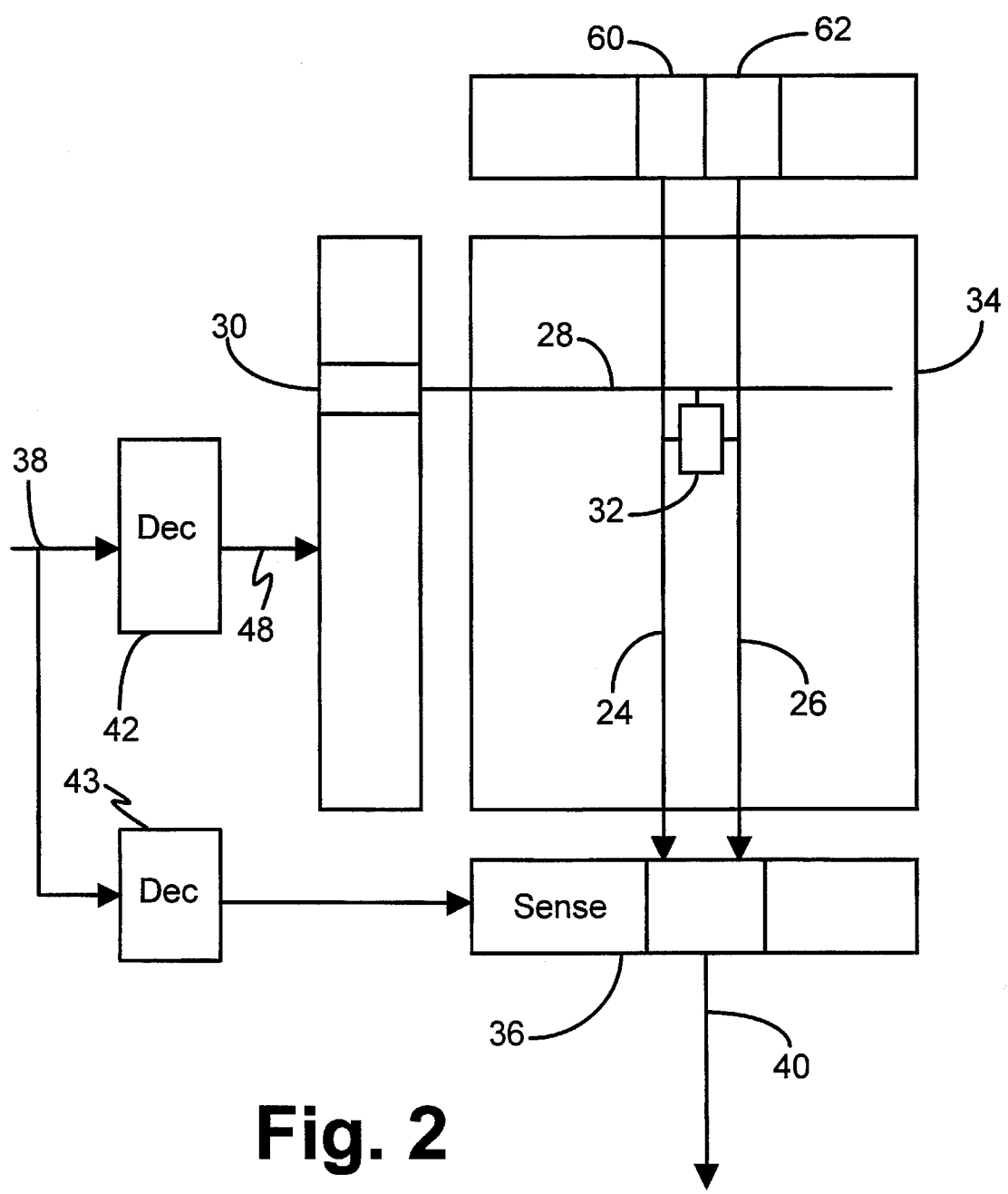
FIG. 2 is a block diagram for a RAM having bipolar word-line drivers.

FIG. 2 is a block diagram for a random-access memory (RAM) having bipolar word-line drivers. An address 38 is input to decoder block 42, which select one row or word line 28 for access. One word-line driver 30 is activated, while the other word-line drivers in an array of word-line drivers are disabled. The activated word line 28 enables the pass transistors in memory cell 32, coupling the memory cell 32 to the bit lines 24, 26. Sense amp array 36 receives the read signal from the selected memory cell via bit lines 24, 26, and read signals from bit lines from other cells connected to word line 28 (not shown). Decoder block 43 selects one pair of bit lines 24, 26 from RAM array 34 for output by sense amp array 36. Data output 40 is an amplified signal representing the data stored in memory cell 32.

Word-line driver 30 was constructed from CMOS transistors in the prior-art. Bipolar transistors can advantageously drive the large capacitance of the word lines. However, BiCMOS processes are usually restricted to NPN transistors. Two main types of drivers can be constructed from NPN transistors: the emitter follower and the common emitter.

Figure 3:
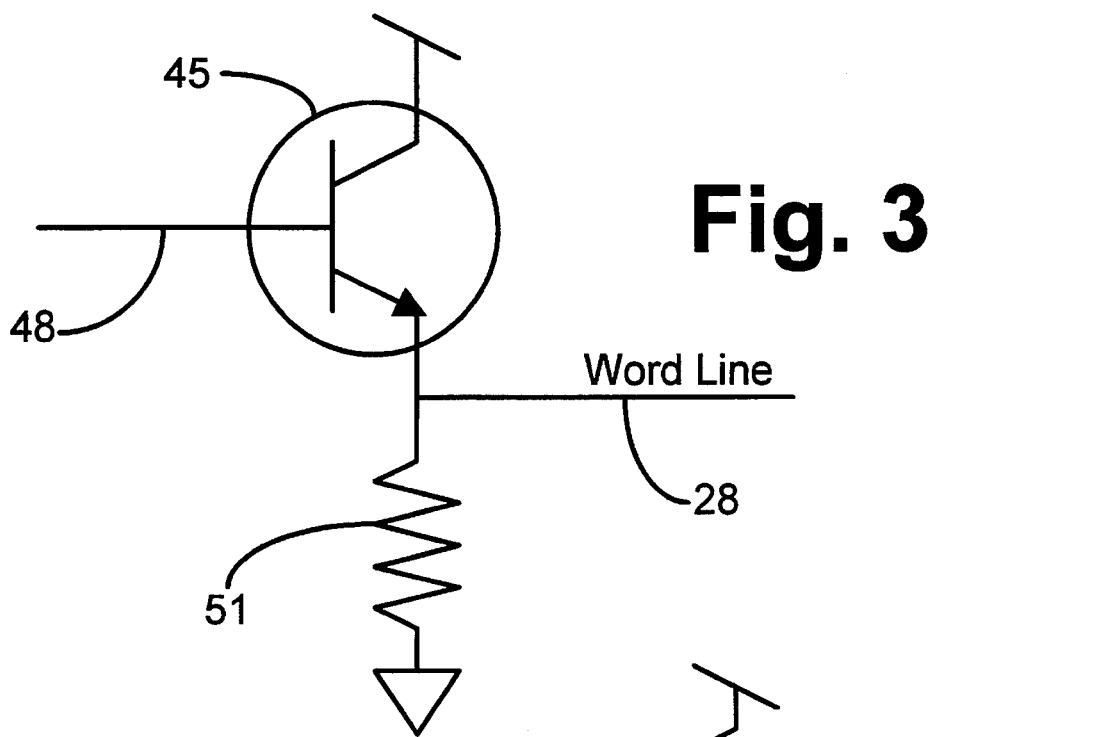
FIG. 3 is an emitter-follower word-line driver.

The emitter-follower driver of FIG. 3 drives the word line 28 in response to a select input 48 from decoder block 42 of FIG. 2. NPN transistor 45 will pull word line 28 high when the base voltage on select input 48 is at least the diode turn-on voltage higher than the emitter voltage on word-line 28. Thus NPN transistor 45 will drive the word line 28 high when the select input is about 0.7 volts higher than the word line 28. Pull-down device 51 pulls word line 28 to ground when the NPN transistor 45 is not turned on.

The emitter-follower driver of FIG. 3 has several disadvantages. Because the base voltage must be 0.7 volts above the emitter voltage for the NPN transistor 45 to be turned on, when the emitter voltage rises as the word line 28 is being driven high, the base voltage must also rise or the NPN transistor 45 will be turned off. Select input 48 must stay 0.7 volts above the rising voltage of word line 28. The maximum voltage on word line 28 is thus about 0.7 volts below the power supply. Because the maximum voltage on the word line 28 is less than the full power-supply voltage, the drive on pass transistors 20, 22 will be diminished, requiring that they be enlarged, decreasing the density of the RAM array. Another problem is that the select voltage 48 must have a large and controlled voltage swing, from 0.7 volts above ground to the power supply. Simply switching from 0 to 5 volts on select input 48 would require a higher-powered decoder output driver with a larger delays than when only a 0.5-volt swing is required. Generating the proper select input 48 for the emitter-follower driver is thus difficult.

Figure 4:
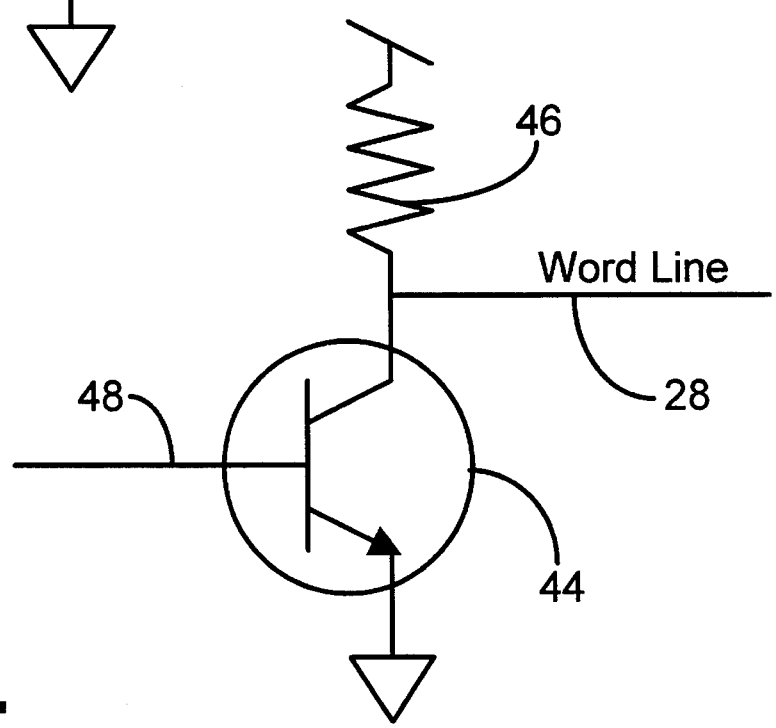
FIG. 4 is a common-emitter word-line driver.

The common emitter driver of FIG. 4 has a resistor 46 for pulling up the output, word line 28. An NPN transistor 44 pulls the word line 28 low. NPN transistor 44 has its emitter connected to ground, and the base input connected to select input 48, which is output from decoder block 42. A small base current into the base of the NPN transistor 44 will produce a large collector current flowing from the word line 28 to ground through the NPN transistor 44. The beta of the NPN transistor 44 is the current amplification factor, or the ratio of the collector current to the base current. Typically the beta can be 100 or 200. Thus the collector current can be very large for even a small base current.

Select input 48 must be biased at a diode turn-on voltage above ground for the NPN transistor 44 to turn on. This diode turn-on voltage is typically 0.7 volts. The base current will increase exponentially as 0.7 volts is reached. Thus a select input 48 voltage swing of 0.3 to 0.9 volts is sufficient to turn the NPN transistor 44 on and off. The size of the resistor 46 is selected so that when NPN transistor 44 is turned on, the word line 28 is rapidly pulled down toward ground, while when NPN transistor 44 is turned off, the resistor 46 can pull the word line 28 up toward the power supply voltage. Resistor 46 may need to be large in area to achieve the low resistance necessary for a fast pull-up of the word line 28. However, the NPN transistor 44 may not have to be enlarged since it amplifies a small base current from select input 48 and can switch on and off in response to the select input 48. Since NPN transistor 44 is an active device, while resistor 46 is a passive device, the pull-down of the output of the common emitter driver will be more rapid than the pull-up. Thus the common emitter is better suited for driving the word line 28 low than driving the word line 28 high.

Another problem with using the common emitter driver when the prior-art 6T RAM cell is used in FIG. 2 is that the power consumption is very high. Only one of the word lines is selected at any given time. Typically 128 or more word lines must be driven in array 34. The selected word line has a high voltage while the other 127 de-selected word lines are at ground.

The common emitter of FIG. 4 has a current path from power to ground when the NPN transistor 44 is turned on, but no direct power-to-ground path when the NPN transistor 44 is turned off. Thus power consumption is high when the NPN transistor 44 is on, when the word line is low. Since all 127 deselected word lines are low, and only one word line 28 is high, power consumption is high when the common emitter driver is used with the prior-art 6T CMOS memory cell.

The common-emitter driver of FIG. 4 could be used with a modified 6T memory cell. For example, inverting the polarity of all transistors in the memory cell would produce p-channel pass transistors and p-channel driver transistors, with n-channel load transistors. The p-channel pass transistors are turned on by a low word-line voltage rather than a high voltage. This is ideal for the common-emitter driver because only one of the 128 word lines would be selected and at a low voltage. Only the one selected word line at the low voltage would cause power to be dissipated in the common-emitter driver. The 127 de-selected word lines would be pulled up to the power-supply voltage by resistor 46, while NPN transistor 44 is turned off in each of the 127 de-selected word-line drivers. Thus only one of the 128 word-line drivers would dissipate power if an inverted 6T cell were used with common-emitter word-line drivers. However, the prior-art 6T memory cell would have 127 word-line drivers dissipating power.

A simple inverted 6T memory cell is described by Blake in U.S. Pat. No. 4,623,989 assigned to Texas Instruments, Inc. Blake's memory cell is used in a CMOS memory. However, Blake's cell requires that the bit-lines be precharged to ground and to swing upward when the cell is read, complicating the sense amplifier and precharge logic. Furthermore, Blake uses p-channel driver transistors which suffer from the lower hole mobility and therefore must be considerably larger in area than n-channel driver transistors.

The present invention recognizes that only the pass transistors need to be inverted to p-channel for use with the common-emitter word-line driver. The higher current-drive n-channel driver transistors can still be used with the p-channel pass transistors. Since n-channel is more area efficient than p-channel when driving a current, using n-channel for the drivers is preferable to Blake's cell which uses p-channel drivers. The load transistors are p-channel in the present invention, which is advantageous since load transistors are designed for low current-drive. Blake's cell uses n-channel load transistors, which have a higher drive than the p-channel load transistors of the present invention.

Figure 5:
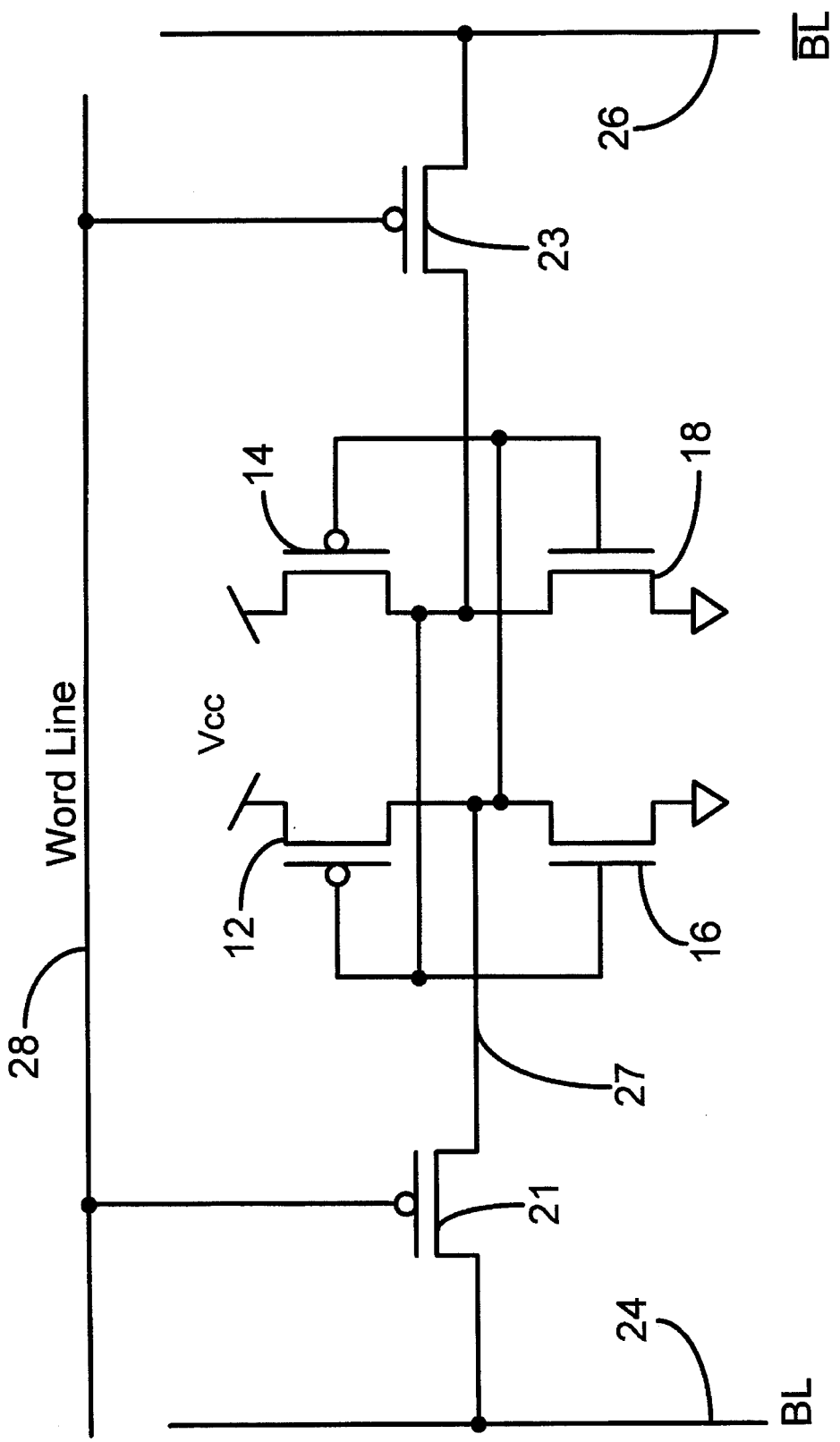
FIG. 5 shows a p-channel pass transistor RAM cell.

FIG. 5 shows a p-channel pass transistor cell of the present invention. P-channel pass transistors 21, 23 connect to word line 28, which selects the cell by applying a low voltage on the gates of p-channel pass transistors 21, 23. Bit lines 24, 26 are connected to the cell by p-channel pass transistors 21, 23 when a low voltage is applied to word line 28. Two cross-coupled inverters inside the cell consist of p-channel load transistors 12, 14 and n-channel driver transistors 16, 18.

P-CHANNEL PASS TRANSISTOR IN SATURATED REGION

Pass transistors 21, 23 may be operated in the saturated region of transistor operation. The saturated region is preferable since the drain current through the transistor is not dependent on the drain-to-source voltage, but only on the gate-to-source voltage. Since the source and drain voltages vary with time as the memory cell is being read, the current through pass transistors operating in the linear region will also vary.

Figure 1:
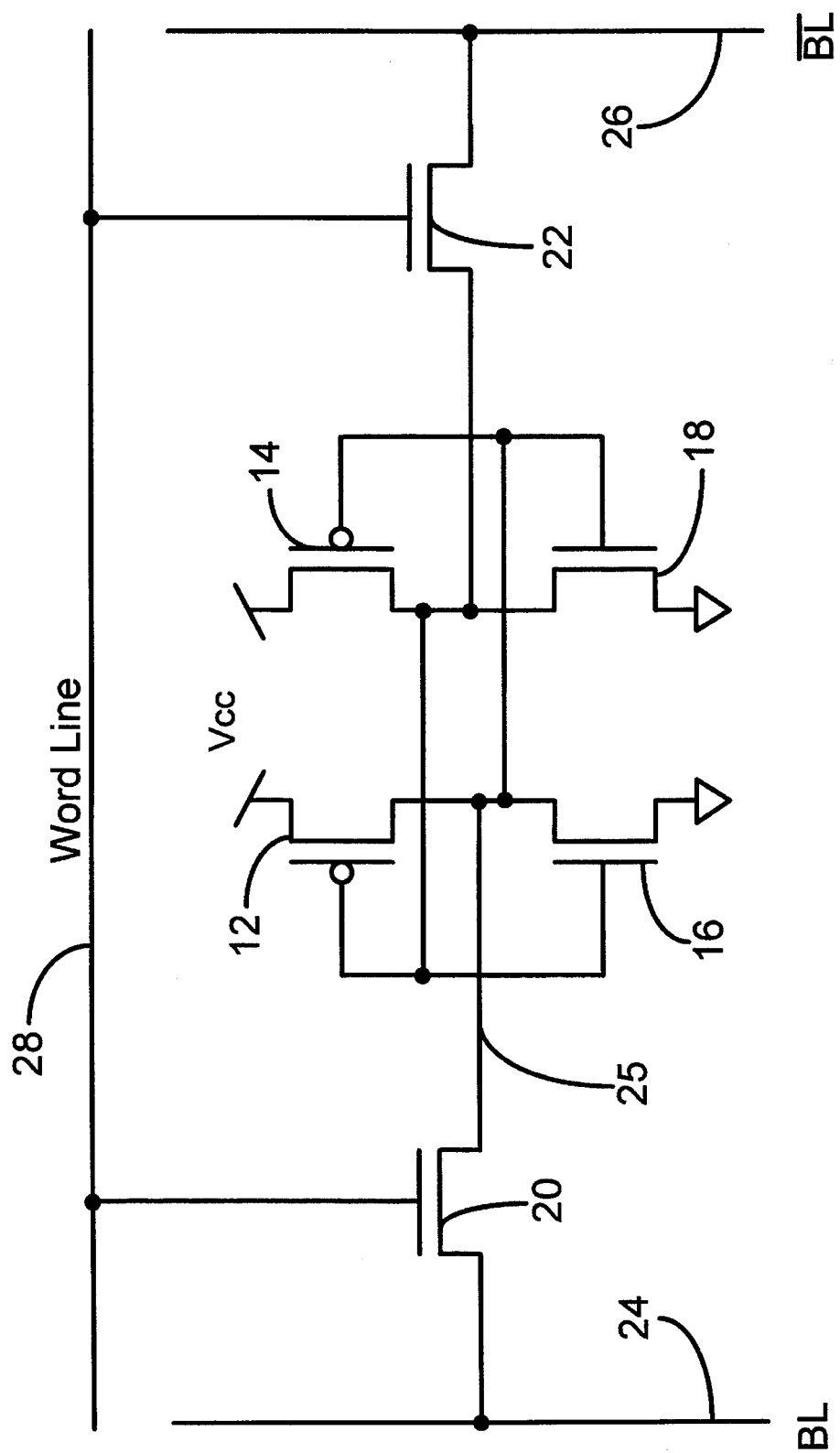
FIG. 1 is a schematic diagram for a prior-art 6-transistor CMOS memory cell.

In the prior-art cell of FIG. 1, pass transistor 20 is coupled between bit line 24 and internal node 25. Five volts, the power supply voltage, is applied to the gate of pass transistor 20, while bit line 24 is initially precharged to 3.5 volts. When internal node 25 is high, little or no current will flow through pass transistor 20, except to lower internal node 25 to the bit-line voltage. However, when internal node 25 is low, current will flow from bit line 24, through pass transistor 20, and driver transistor 16 to ground. Internal node 25 will rise up somewhat, but not enough to flip the cell over. Internal node 25 will have a lower voltage than bit line 24, which means that internal node 25 is coupled to the source of pass transistor 20 while the bit line 24 is connected to the drain of pass transistor 20. The gate-to-drain voltage is 5.0−3.5=1.5 volts, which is greater than the threshold voltage of 0.7 to 1.1 volts. Thus pass transistor 20 is operating in the linear region and the drain current will vary with the drain-to-source voltage across pass transistor 20.

In contrast, the pass transistor 21 of the present invention operates in the saturated region. Referring to FIG. 5, if internal node 27 is high, then only a small equalization current will flow through pass transistor 21, bringing internal node 27 from 5.0 volts down to the bit-line voltage of 3.5 volts. However, when internal node 27 is low, a read current flows from bit line 24 through pass transistor 21 and driver transistor 16 to ground. Internal node 27 will rise up in voltage somewhat, but not enough to trip the cell. However, since pass transistor 21 is a p-channel device, the source and drain nodes are reversed relative to the n-channel device. Thus the source has the higher voltage and the drain the lower voltage. Bit line 24 is therefore coupled to the source of pass transistor 21 while internal node 27 is at the drain. The memory cell may be designed such that the internal node 27 does not rise up more than the magnitude of the n-channel threshold voltage. Driver transistor 16 is made large enough to keep internal node 27 below 0.7 volts when the memory cell is initially coupled to the bit lines 24, 26.

The exact size of driver transistor 16 can be chosen with well-known design techniques and confirmed with circuit simulators such as SPICE.

The gate-to-drain voltage for pass transistor 21 is 0–0.7= −0.7 volts, if the memory cell is designed so that internal node 27 cannot rise above 0.7 volts. Since the p-channel threshold voltage is −0.7 volts, pass transistor 21 is operating in the saturated region. In the saturated region, the drain current is not dependent on the drain-to-source voltage through pass transistor 21. Thus the current through pass transistor 21 will vary little with time because of the charging of internal node 27, in contrast with the prior-art memory cell. Since the read voltage at the bit line is kept small, the gate-to-source voltage of pass transistor 21 is reduced only slightly.

Therefore p-channel pass transistor 21 acts essentially as a relatively constant-current device, while n-channel pass transistor 20 acts as an source follower, whose current depends on the drain-source voltage. The constant-current device aids cell stability by having a constant read current through the memory cell, acting as a very high impedance for the cross-coupled driver transistors 16, 18. With the prior art n-channel pass transistors, the n-channel pass transistor connected to the internal node in the high logic state is essentially turned off. However, with the present invention's p-channel pass transistors, both pass transistors are on, aiding cell stability by maintaining the high logic state of the internal node.

BIT-LINE SENSING

Another advantage of the p-channel pass transistor cell is that the bit lines 24, 26 have the same voltage swing as in the standard prior-art 6T cell. Thus the bit lines 24, 26 are precharged high and pulled low by the driver transistor in the cell when read. Standard sense amplifiers and precharge logic may be used. This simplifies the design of the memory, allowing existing standard cell blocks to be used for the sense amplifiers.

The memory cell is accessed when the word line 28 is pulled low. The access time of the memory cell includes the delay to drive the word line 28 low. The common-emitter word-line driver of FIG. 4 uses a passive device, resistor 46, to pull the word line 28 high. Resistor 46 does not have to quickly pull the word line 28 high since the high voltage deselects the memory cell and deselection is not part of the access time of the memory cell. Thus resistor 46 is not a speed-critical device and can be made smaller than if it actively selected the memory cell.

The common-emitter driver has the active device used for pulling down the word line 28. Since the active device, the NPN transistor 44, has a high gain, a small signal on the select input 48 will be amplified to the word line 28. Since a small signal can be generated much more rapidly than a larger signal, a faster access and selection of the word line 28 results from using the common-emitter word-line driver. The decoder block 42 does not have to provide select input 48 having a full voltage swing, and thus decoder block 42 may be made faster than in prior-art decoders requiring full-swing outputs.

Common-emitter bit-line drivers may also be employed to pull one of the bit lines 24, 26 low during a write to the memory cell. The output of the common emitter driver of FIG. 4 is coupled to the bit lines 24, 26 instead of the word line 28. FIG. 2 shows bit-line driver 60 coupled to bit line 24 and bit-line driver 62 coupled to bit line 26. Each bit-line driver 60, 62 contains a common-emitter driver as in FIG. 4. A data input and write circuitry (not shown) provide inputs to bit-line drivers 60, 62.

Thus a memory has been disclosed that is ideally suited for BiCMOS processes. Common-emitter word-line drivers require a small input-voltage swing which is amplified by an active NPN transistor which drives the word line 28 low. A low voltage on the word line 28 selects a memory cell by causing p-channel pass transistors to conduct, coupling bit lines 24, 26 to the cross-coupled inverters in the memory cell. The cross-coupled inverters use area-efficient n-channel transistors for the drive transistors, which pull a bit line low during a read operation. The weaker p-channel transistors are used for load transistors in the cross-coupled inverters, maintaining cell stability while requiring a smaller cell area than if higher-drive n-channel transistors were used as load transistors.

Power consumption is reduced since only one selected word line is at a low voltage, while the deselected word lines are at a high voltage. Common-emitter word-line drivers have a power-to-ground conduction path when the output word line is low, but no conduction path when the output word line is high. Thus only the common-emitter word-line driver that is connected to the selected low word line consumes appreciable power.

ALTERNATE EMBODIMENTS

Several other embodiments are contemplated by the inventors. For example the number of word lines may be greater or less than 128. Different arrangements of the memory array and decoder blocks are possible within the spirit of the invention. Device sizes may be varied somewhat. The resistors can be implemented using diffused regions on a silicon substrate, or as MOS transistors with the gates tied to power or ground and biased in the linear region.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A CMOS memory cell coupled to a pair of bit lines for communicating data, the pair of bit lines having a first bit line and a second bit line, the memory cell further coupled to a word line for selecting a row of memory cells in the memory device, the CMOS memory cell comprising:

a first inverter having a first p-channel load transistor and a first n-channel driver transistor, the first inverter having a first output and a first input;

a second inverter having a second p-channel load transistor and a second n-channel driver transistor, the second inverter having a second output and a second input;

the first output of the first inverter coupled to the second input of the second inverter and the second output of the second inverter coupled to the first input of the first inverter;

a first p-channel pass transistor coupled to conduct current between the first output and the first bit line, the first p-channel pass transistor having a first gate coupled to the word line; and a second p-channel pass transistor coupled to conduct current between the second output and the second bit line, the second p-channel pass transistor having a second gate coupled to the word line.

2. The CMOS memory cell of claim 1 in further combination with:

read biasing means, coupled to the word line and the pair of bit lines, for applying a first voltage to the word line and initially precharging the pair of bit lines to a second voltage, the first voltage and the second voltage causing a read current to flow through the first p-channel pass transistor and the first n-channel drive transistor when the CMOS memory cell is in a first logic state, the read current flowing through the second p-channel pass transistor and the second n-channel drive transistor when the CMOS memory cell is in a second logic state.

3. The combination of claim 2 further comprising:

a common-emitter driver, having a pull-up device coupled to the word line and an NPN transistor having a collector coupled to the word line, the common-emitter driver having a select input coupled to a base input of the NPN transistor, the NPN transistor conducting current away from the word line, causing a low voltage to occur on the word line when the select input indicates that the memory cell coupled to the word line be selected, the low voltage sufficient to cause the first p-channel pass transistor and the second p-channel pass transistor to conduct current;

the select input disabling the NPN transistor from conducting current away from the word line when the select input indicates that the word line not be selected, allowing the pull-up device to pull the word line to a high voltage, the high voltage sufficient to cause the first p-channel pass transistor and the second p-channel pass transistor not to conduct current.

4. The combination of claim 3 wherein the second p-channel pass transistor provides a small compensation current in a linear region of operation when the low voltage is applied to the word line and the CMOS memory cell is in the first logic state, the small compensation current sufficient to compensate for any leakage current otherwise lowering a high logic state of the second output.

5. The combination of claim 3 further comprising:

a first common-emitter bit-line driver, coupled to the first bit line, the first common-emitter bit-line driver having a pull-up device coupled to the first bit line and an NPN transistor having a collector coupled to the first bit line, the NPN transistor having a base input receiving datum for writing to the memory cell, the first common-emitter bit-line driver pulling the first bit line low when the base input indicates that the datum is a binary low;

a second common-emitter bit-line driver, coupled to the second bit line, the second common-emitter bit-line driver having a pull-up device coupled to the second bit line and an NPN transistor having a collector coupled to the second bit line, the NPN transistor having a base input receiving an inverse datum for writing to the memory cell, the second common-emitter bit-line driver pulling the second bit line low when the base input indicates that the inverse datum is a binary low.

6. A bipolar-CMOS memory device comprising:

a pair of bit lines for communicating data, the pair of bit lines having a first bit line and a second bit line;

a word line for selecting a row of memory cells in the memory device;

a CMOS memory cell further comprising a first inverter having a first p-channel load transistor and a first n-channel driver transistor, the first inverter having a first output coupled to a drain of the first p-channel load transistor and coupled to a drain of the first n-channel driver transistor, the first inverter having a first input coupled to a gate for the first p-channel load transistor and coupled to a gate for the first n-channel driver transistor;

a second inverter having a second p-channel load transistor and a second n-channel driver transistor, the second inverter having a second output coupled to a drain of the second p-channel load transistor and coupled to a drain of the second n-channel driver transistor, the second inverter having a second input coupled to a gate for the second p-channel load transistor and coupled to a gate for the second n-channel driver transistor;

the first output of the first inverter coupled to the second input of the second inverter and the second output of the second inverter coupled to the first input of the first inverter;

a first p-channel pass transistor coupled to conduct between the first output and the first bit line, the first p-channel pass transistor having a first gate coupled to the word line;

a second p-channel pass transistor coupled to conduct between the second output and the second bit line, the second p-channel pass transistor having a second gate coupled to the word line; and read biasing means, coupled to the word line and the pair of bit lines, for applying a first voltage to the word line and initially precharging the pair of bit lines to a second voltage, the first voltage and the second voltage causing a read current to flow through the first p-channel pass transistor and the first n-channel drive transistor when the CMOS memory cell is in a first logic state, the read current flowing through the second p-channel pass transistor and the second n-channel drive transistor when the CMOS memory cell is in a second logic state.

7. The device of claim 6 further comprising:

a common-emitter driver, having a pull-up device coupled to the word line and an NPN transistor having a collector coupled to the word line, the common-emitter driver having a select input coupled to a base input of the NPN transistor, the NPN transistor conducting current away from the word line, causing a low voltage to occur on the word line when the select input indicates that the memory cell coupled to the word line be selected, the low voltage sufficient to cause the first p-channel pass transistor and the second p-channel pass transistor to conduct;

the select input disabling the NPN transistor from conducting current away from the word line when the select input indicates that the word line not be selected, allowing the pull-up device to pull the word line to a high voltage, the high voltage sufficient to cause the first p-channel pass transistor and the second p-channel pass transistor not to conduct.

8. The device of claim 7 wherein the first p-channel pass transistor conducts current in a constant-current region of operation when the low voltage is applied to the word line and the CMOS memory cell is in the first logic state.

9. The device of claim 7 further comprising:

a first common-emitter bit-line driver, coupled to the first bit line, the first common-emitter bit-line driver having a pull-up device coupled to the first bit line and an NPN transistor having a collector coupled to the first bit line, the NPN transistor having a base input receiving datum for writing to the memory cell, the first common-emitter bit-line driver pulling the first bit line low when the base input indicates that the datum is a binary low;

a second common-emitter bit-line driver, coupled to the second bit line, the second common-emitter bit-line driver having a pull-up device coupled to the second bit line and an NPN transistor having a collector coupled to the second bit line, the NPN transistor having a base input receiving an inverse datum for writing to the memory cell, the second common-emitter bit-line driver pulling the second bit line low when the base input indicates that the inverse datum is a binary low.

10. The device of claim 9 wherein the select input is driven by a decoder, and the select input has a small voltage swing.

11. The device of claim 10 wherein the small voltage swing is about 0.3 to 0.9 volts.

12. The device of claim 6 wherein the first n-channel driver transistor has a greater current drive than the first p-channel load transistor and the second n-channel driver transistor has a greater current drive than the second p-channel load transistor.

13. The device of claim 12 wherein the first p-channel load transistor has a current drive of less than one-sixth the current drive of the first n-channel driver transistor, and the second p-channel load transistor has a current drive of less than one-sixth the current drive of the second n-channel driver transistor.

14. The device of claim 6 wherein either the first bit line or the second bit line decrease in voltage when a reading from the memory cell.

15. The device of claim 7 wherein the pull-up device is a transistor having a gate tied to a constant voltage, the transistor acting as a load device.

* * * * *